(12) United States Patent
Brauers et al.

(10) Patent No.: US 6,363,135 B1
(45) Date of Patent: Mar. 26, 2002

(54) SENSOR WITH A GUARD ELECTRODE

(75) Inventors: Andreas Brauers; Ulrich Schiebel, both of Aachen (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/590,254

(22) Filed: Jun. 8, 2000

(30) Foreign Application Priority Data

Jun. 11, 1999 (DE) .......................... 199 26 582

(51) Int. Cl.[7] .............................. H05G 1/64; G01T 1/24; H01L 27/00
(52) U.S. Cl. .................................. 378/98.8; 250/370.09
(58) Field of Search ..................... 250/370.08, 370.09; 378/98.8

(56) References Cited

U.S. PATENT DOCUMENTS

| 5,132,541 A | * | 7/1992 | Conrads et al. | 250/370.01 |
| 5,184,018 A | * | 2/1993 | Conrads et al. | 250/370.09 |
| 5,396,072 A | * | 3/1995 | Schiebel et al. | 250/370.09 |
| 5,598,004 A | * | 1/1997 | Powell et al. | 250/370.09 |
| 5,729,021 A | * | 3/1998 | Brauers et al. | 250/370.09 |
| 6,021,173 A | * | 2/2000 | Brauers et al. | 378/98.8 |
| 6,075,248 A | * | 6/2000 | Jeromin et al. | 250/370.09 |
| 6,194,727 B1 | * | 2/2001 | Lee et al. | 250/370.09 |

FOREIGN PATENT DOCUMENTS

| WO | WO9710616 | 3/1997 | ......... H01L/31/115 |

* cited by examiner

Primary Examiner—Robert H. Kim
Assistant Examiner—Allen C. Ho

(57) ABSTRACT

The invention relates to a sensor which includes a reference electrode as well as a plurality of sensor elements, each sensor element including a collector electrode and a photoconductor structure which is arranged between the reference electrode and the collector electrodes, as well as a switching element which connects the collector electrode to a read-out lead, the sensor elements being arranged in a matrix of n rows and m columns, where n, m are larger than 1. Correct operation of even the sensor elements in the edge zone of the matrix is achieved, irrespective of the construction of the edge of the photoconductor structure and the reference electrode, in that the matrix is provided with a guard electrode window (9) which is arranged between the read-out lead (5) and the photoconductor structure (6) of the sensor elements (21) constituting the edge of the matrix and extends beyond the edge of the photoconductor structure (6).

16 Claims, 3 Drawing Sheets

SENSOR WITH A GUARD ELECTRODE

BACKGROUND OF THE INVENTION

The invention relates to a sensor which includes a reference electrode as well as a plurality of sensor elements, each sensor element including a collector electrode and a photoconductor structure which is arranged between the reference electrode and the collector electrodes, as well as a switching element which connects the collector electrode to a read-out lead, the sensor elements being arranged in a matrix of n rows and m columns, where n, m are larger than 1. The invention also relates to an X-ray examination apparatus which includes an X-ray source for emitting an X-ray beam for irradiating an object so as to form an X-ray image, as well as a detector for producing an electrical image signal from said X-ray image.

A sensor of this kind is known from WO 97/10616. The known X-ray image sensor includes a matrix with a plurality of sensor elements which are sensitive to X-rays and are arranged in rows and columns. Each sensor element is composed of a collector electrode, a single-line photoconductor structure and a common reference electrode. The photoconductor layer, consisting of selenium (Se) or lead oxide (PbO), absorbs incident X-rays and generates electron hole pairs. Under the influence of a static electrical field, applied across the photoconductor layer between the reference electrode and the collector electrodes, the holes travel to the reference electrode and the electrons are collected by the collector electrodes or vice versa, depending on the relevant polarization of the electrodes. Each collector electrode is connected to a switching element. In order to read out the collected charges, the switching elements are opened and the collected charge is conducted to appropriate read-out leads, after which they flow into appropriate amplifiers which subsequently apply a charge signal to a multiplexer which converts the charge signals from the corresponding read-out leads into an electronic signal.

The sensor elements which are situated at the edge of such a sensor matrix do not always operate correctly. On the one hand, the photoconductor structure is in contact with the atmosphere, because there are no neighboring sensor elements on one side, thus enabling moisture and oxygen to exert a negative effect on the layer materials such as selenium or PbO. On the other hand, undesirable signal contributions arise because of capacitive coupling into the read-out leads and address leads connected to the collector electrodes if the photoconductor structure and/or the reference electrode extend beyond the active imaging surface. This produces undesirable noise.

OBJECTS AND SUMMARY OF THE INVENTION

Therefore, it is an object of the present invention to achieve correct operation also for the sensor elements at the edge of the matrix, irrespective of the construction of the edge of the photoconductor structure and the reference electrode.

This object is achieved by means of a sensor according to the invention which is characterized in that the matrix is provided with a guard electrode window which is arranged between the read-out lead and the photoconductor structure of the sensor elements constituting the edge of the matrix and extends beyond the edge of the photoconductor structure, i.e. beyond the edge of the active imaging surface.

The guard electrode window in a first embodiment is preferably composed of one or more large-area guard electrodes. The solution involving a large-area guard electrode offers advantages in respect of technical implementation. The overall window may be composed of a plurality of sub-windows, for example two sub-windows.

The guard electrode window in a second embodiment consists of so many individual guard electrodes that each sensor element constituting the edge of the matrix is provided with a guard electrode.

Because of the guard electrode window proposed according to the invention, disturbances in the form of parasitic capacitances between the reference electrode and the read-out leads are suppressed in the sense of shielding in the case of a non-ideal construction of the edge layer of the photoconductor structure and the reference electrode.

Moreover, the photoconductor structure may be provided so as to extend even beyond the active imaging surface, for example by the stepped stacking of several layers. This offers the advantage that material inhomogeneities at the edge of the individual layers of the photoconductor structure which are due to the manufacturing process will be situated outside the active imaging surface and will not lead to image defects. Furthermore, in a technological sense it is easier to realize a stepped configuration of a multilayer photoconductor structure than an ideal vertical section.

Preferably, the guard electrode is arranged at a layer level corresponding to the collector electrode. This enables the guard electrode window and the collector electrode to be provided simultaneously during the same process step of the manufacturing process utilizing the thin-film technique.

Furthermore, the object is also achieved by means of a sensor which is characterized in that the edge zone of the photoconductor structure of the sensor elements constituting the edge of the matrix is provided with a passivation layer which is impermeable to moisture and air, and that the photoconductor structure is composed of at least two photoconductor layers which are arranged one above the other and consist of a different material, the material chosen for one layer being lead oxide whereas the material chosen for a second layer is selenium.

According to the invention, the deposition of a lead oxide layer provides compensation for the very sensitive selenium layer within the multilayer photoconductor structure. The proposed passivation layer prevents negative effects of the atmosphere on the photoconductor layers and hence disturbing effects on the edge zones. The passivation layer preferably consists of a synthetic material such as polyethylene, polyxylylene (known as Parylene®) or polyurethane.

In a preferred embodiment of the invention, the edge zone of the matrix of a sensor of the kind set forth which includes a multilayer photoconductor structure is shielded by a guard electrode window as well as protected by a passivation layer.

Further details and advantages of the invention will become apparent from the dependent Claims and the following description in which the embodiments according to the invention as shown in the Figures are further elucidated. Therein:

DESCRIPTION OF THE PREFERRED EMBODIMENTS

FIG. 1 shows a circuit diagram of an X-ray sensor matrix according to the invention;

FIG. 2 is a diagrammatic sectional view of the thin-film structure of an X-ray sensor with a guard electrode window;

FIG. 3 is a diagrammatic sectional view of the thin-film structure of a multilayer X-ray sensor provided with a passivation layer;

FIG. 4 shows an X-ray examination apparatus which includes an X-ray sensor according to the invention.

DESCRIPTION OF THE PREFERRED EMBODIMENTS

FIG. 1 shows a circuit diagram of an X-ray sensor matrix 1 according to the invention. Even though the circuit diagram shows only three times three sensor elements, a practical embodiment of a matrix comprises, for example 2,000×2,000 sensor elements. The sensor elements constituting the edge of the matrix are denoted by the reference numeral 21 whereas the central sensor element is denoted by the reference numeral 20. For each pixel there is provided a sensor element 21, 20 which is sensitive to X-rays and includes a photosensor 22, a capacitance 23 and a switching element 4. The switching elements 4 are preferably constructed as TFTs (thin-film transistors). Incident X-rays are converted into charges by means of the photosensor 22, said charges being collected by means of the capacitance 23. The collector electrodes 3 form part of the corresponding capacitances 23. Each column of the matrix is in this case provided with a corresponding read-out lead 5, and each capacitance 23 is connected to the corresponding read-out lead 5 via a switching element 4. The read-out leads 5 are connected to amplifiers 24 which conduct the output signals to multiplexers 25. The switching elements 4 are controlled by means of a circuit 26 which is connected, by way of address leads 27, to the switching elements 4 for each row. The multiplexer 25 applies the electronic image signal to a monitor 28 or an image processor 29.

FIG. 2 is a diagrammatic sectional view of the thin-film structure of an X-ray sensor element 21 according to the invention. The Figure shows a sensor element 21 which is situated at the edge of the matrix. The sensor element includes a photoconductor structure 6 which is formed between a general reference electrode 2 and a collector electrode 3. Incident X-rays are absorbed in the photoconductor structure 6 and electron hole pairs are generated. The reference electrode and the collector electrodes act as a cathode and an anode, respectively, under the influence of an applied electrical field. The collector electrode 3 is embedded in a passivation layer 7 on a substrate 8, for example a glass layer, and connected to a read-out lead 5 via a switching element (not shown).

On the collector electrode 3, being formed as a thin metal layer of, for example gold or aluminum, there is provided the photoconductor structure 6 having a multi-layer construction. It is composed of a first PbO layer (6a), followed by a layer of Se (6b). The lead oxide may concern polycrystalline lead oxide ($PbO_z$, $0<x\leq2$). It is adjoined by the reference electrode 2. The reference electrode is a thin metal layer, for example a layer having a thickness in the range of from 100 nm to 1 $\mu$m. In this embodiment it is formed by a layer of gold; other suitable layers are, for example, made of Al, Ag, Pt, Pd etc. The layers 6a, 6b and 2 need not be flush at the edge; in this case the three layers are arranged in a stepped manner.

The guard electrode window 9 is provided at the same level as the collector electrode 3. The guard electrode window is arranged between the passivation layer for the read-out lead 5 and the photoconductor structure 6. The guard electrode window extends beyond the edge zone of the lower layer 6a of the photoconductor structure, carries the same potential as the read-out lead 5 and hence forms a suitable shield against parasitic signals. Moreover, when a guard electrode 9 is provided, the edge layers of the sensor elements need no longer end so as to be flush with but may extend beyond the pixel field. In the case of multilayer structures, for example the PbO layer may be provided so as to extend 3 mm beyond the outer pixel; the Se layer may extend 2 mm beyond this pixel and the Au layer of the reference electrode may extend 1 mm beyond the extreme pixel. Edge effects of the layers will no longer influence the interaction between the reference electrode and the collector electrodes of the edge sensor elements.

A passivation layer 10 is provided along the photoconductor structure 6 on the guard electrode 9 as far as the reference electrode 2. The passivation layer 10 is made of an electrically insulating material such as polyurethane or electrically insulating resin. Polyxylylene ($CH_2—C_6H_4—CH_2)_n$) (Parylene®) is a preferred material.

FIG. 3 shows an edge sensor element with a passivation layer 11 extending along a multilayer photoconductor structure 6. Parts corresponding to FIG. 2 are denoted by corresponding reference numerals. The photoconductor structure 6 is composed of a lower layer PbO (6a) and a layer Se (6b) which is deposited thereon. The passivation layer which is impermeable to moisture and air layer constitutes a protective window for the parts of the edge sensor elements which contact the atmosphere. The layer 11 may extend beyond the reference electrode 2. In all cases, however, an electrical passage to the reference electrode must be provided.

Figure 1:
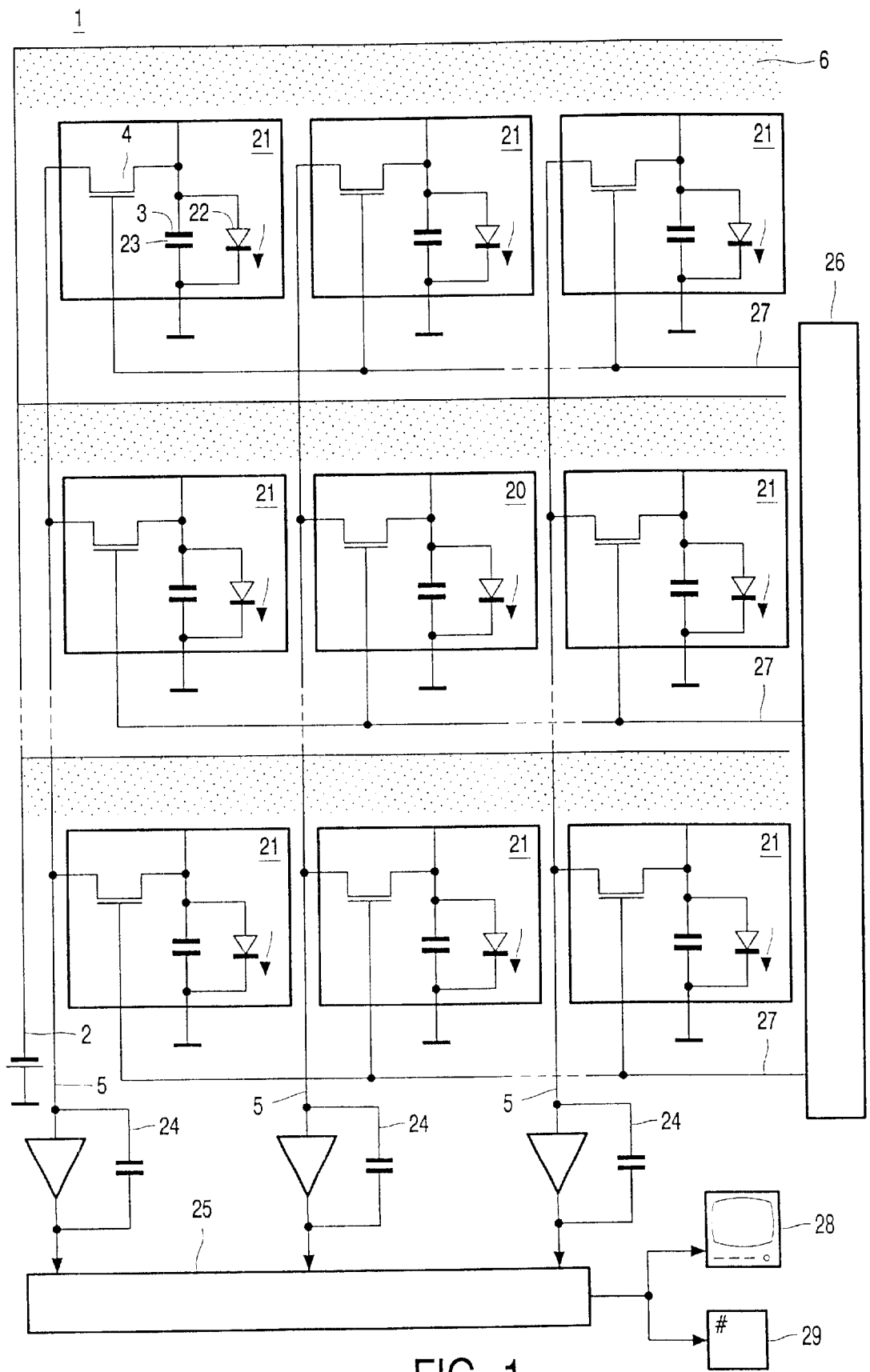
Figure 2:
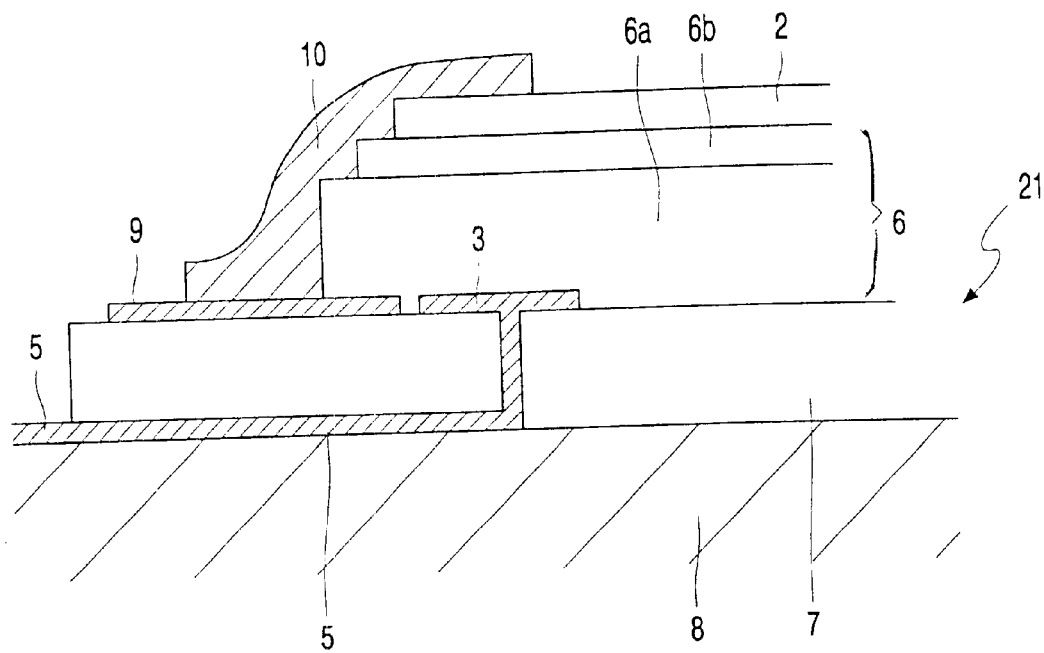
Figure 3:
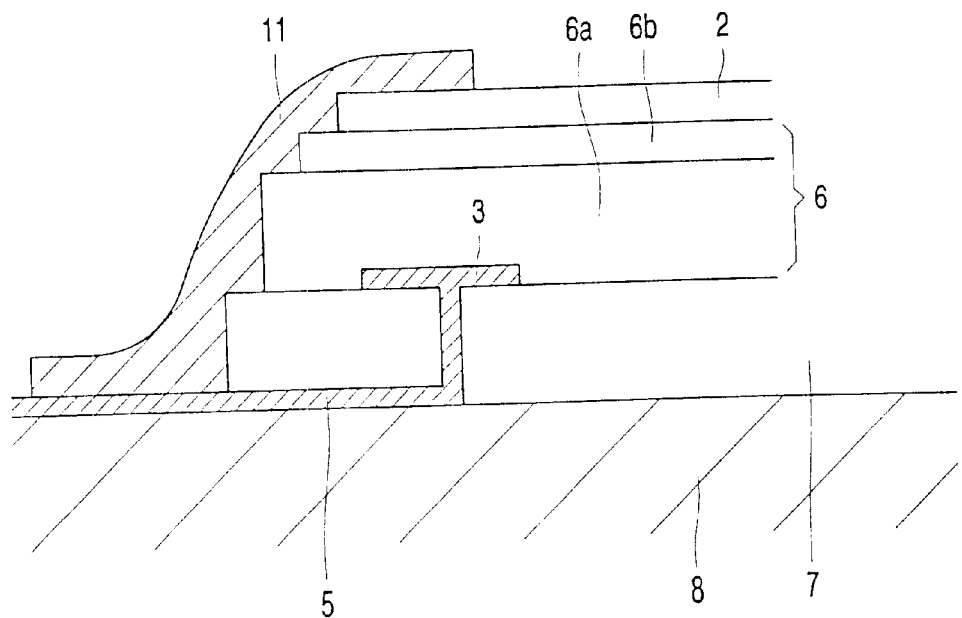
Figure 4:
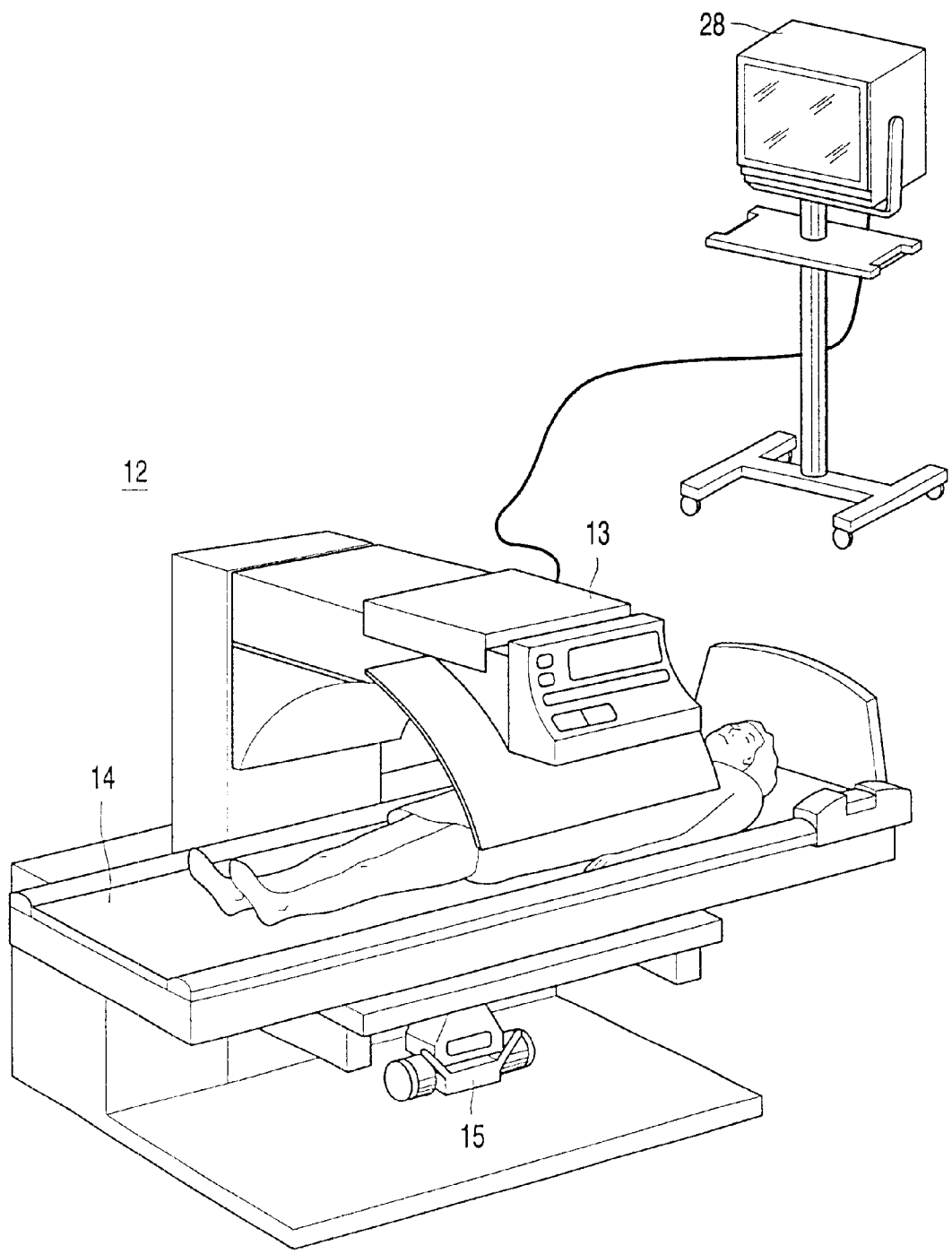
FIG. 4 shows an X-ray examination apparatus 12 which includes a detector 13 provided with an X-ray sensor according to the invention. The X-ray examination apparatus 12 includes a table 14 for a patient. An X-ray source 15 is mounted underneath said table. The X-ray detector 13 is arranged so as to be adjustable relative to the radiation source 14. In order to produce an X-ray image, the patient is irradiated by an X-ray beam. An X-ray image is generated by means of the detector in dependence on local differences in the X-ray absorption by the patient. Using the X-ray sensor, this image is converted into electrical signals which are applied to the monitor 28 in order to display the X-ray image.

What is claimed is:

1. A sensor which includes a reference electrode as well as a plurality of sensor elements, each sensor element including a collector electrode and a photoconductor structure which is arranged between the reference electrode and the collector electrodes, as well as a switching element which connects the collector electrode to a read-out lead, the sensor elements being arranged in a matrix of n rows and m columns, where n, m are larger than 1, characterized in that the matrix is provided with a guard electrode window (9) which is arranged between the readout lead (5) and the photoconductor structure (6) of the sensor elements (21) constituting the edge of the matrix and extends beyond the edge of the photoconductor structure (6).

2. A sensor as claimed in claim 1, characterized in that the guard electrode window (9) is composed of one or more large-area guard electrodes.

3. An x-ray examination apparatus, including an X-ray source for emitting an X-ray beam for irradiating an object so as to form an X-ray image, as well as a detector for generating an electrical image signal from said X-ray image, characterized in that the X-ray detector includes a sensor as claimed in claim 2.

4. A sensor as claimed in claim 1, characterized in that the guard electrode window (9) consists of a plurality of guard electrodes so that with each sensor element (21) constituting the edge of the matrix there is associated a respective guard electrode.

5. An x-ray examination apparatus, including an X-ray source for emitting an X-ray beam for irradiating an object so as to form an X-ray image, as well as a detector for generating an electrical image signal from said X-ray image, characterized in that the X-ray detector includes a sensor as claimed in claim 4.

6. A sensor as claimed in claim 1, characterized in that the guard electrode window (9) is arranged at a layer level corresponding to the collector electrode (3).

7. An x-ray examination apparatus, including an X-ray source for emitting an X-ray beam for irradiating an object so as to form an X-ray image, as well as a detector for generating an electrical image signal from said X-ray image, characterized in that the X-ray detector includes a sensor as claimed in claim 6.

8. A sensor as claimed in claim 1, characterized in that from the guard electrode window (9) the passivation layer (10) extends across the photoconductor structure (6) as far as the reference electrode (2).

9. A sensor as claimed in claim 8, characterized in that the passivation layer (10) extends partly or completely across the reference electrode (2).

10. An x-ray examination apparatus, including an X-ray source for emitting an X-ray beam for irradiating an object so as to form an X-ray image, as well as a detector for generating an electrical image signal from said X-ray image, characterized in that the X-ray detector includes a sensor as claimed in claim 9.

11. An x-ray examination apparatus, including an X-ray source for emitting an X-ray beam for irradiating an object so as to form an X-ray image, as well as a detector for generating an electrical image signal from said X-ray image, characterized in that the X-ray detector includes a sensor as claimed in claim 8.

12. A sensor as claimed in claim 1, characterized as an X-ray image sensor.

13. An x-ray examination apparatus, including an X-ray source for emitting an X-ray beam for irradiating an object so as to form an X-ray image, as well as a detector for generating an electrical image signal from said X-ray image, characterized in that the X-ray detector includes a sensor as claimed in claim 12.

14. An X-ray examination apparatus, including an X-ray source for emitting an X-ray beam for irradiating an object so as to form an X-ray image, as well as a detector for generating an electrical image signal from said X-ray image, characterized in that the X-ray detector includes a sensor as claimed in claim 1.

15. A sensor which includes a reference electrode as well as a plurality of sensor elements, each sensor element including a collector electrode and a photoconductor structure which is arranged between the reference electrode and the collector electrodes, as well as a switching element which connects the collector electrode to a read-out lead, the sensor elements being arranged in a matrix of n rows and m columns, where n, m are larger than 1, characterized in that an edge of the photoconductor structure (6) of the sensor elements (21) constituting the edge of the matrix is provided with a passivation layer (11) which is impermeable to moisture and air, and that the photoconductor structure (6) is composed of at least two photoconductor layers (6a, 6b) of a different material which are arranged one above the other, the material chosen for one layer being lead oxide (6a) whereas the material chosen for a second layer is selenium (6b).

16. An x-ray examination apparatus, including an X-ray source for emitting an X-ray beam for irradiating an object so as to form an X-ray image, as well as a detector for generating an electrical image signal from said X-ray image, characterized in that the X-ray detector includes a sensor as claimed in claim 15.

* * * * *